(12) United States Patent
Park et al.

(10) Patent No.: US 9,768,014 B2
(45) Date of Patent: *Sep. 19, 2017

(54) WAFER COATING (71) Applicant: Applied Materials, Inc., Santa Clara, CA (US)

(72) Inventors: Jungrae Park, Santa Clara, CA (US); Wei-Sheng Lei, San Jose, CA (US); Prabhat Kumar, Fremont, CA (US); James S. Papanu, San Rafael, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 14/658,102

(22) Filed: Mar. 13, 2015

(65) Prior Publication Data
US 2015/0221505 A1 Aug. 6, 2015

Related U.S. Application Data (62) Division of application No. 14/169,502, filed on Jan. 31, 2014, now Pat. No. 8,991,329.

(51) Int. Cl.
*B05C 11/08* (2006.01)
*B05C 11/02* (2006.01)
(Continued)

(52) U.S. Cl.
CPC .......... *H01L 21/02282* (2013.01); *B05B 1/00* (2013.01); *B05B 3/1014* (2013.01);
(Continued)

(58) Field of Classification Search
USPC .......... 118/52, 612, 318, 319, 500; 427/240; 134/153, 198, 902; 396/611, 627
See application file for complete search history.

(56) References Cited

U.S. PATENT DOCUMENTS 3,993,018 A 11/1976 Kranik et al.
4,049,944 A 9/1977 Garvin et al.
(Continued)

FOREIGN PATENT DOCUMENTS

JP 9216085 8/1997
JP 10321908 12/1998
(Continued)

OTHER PUBLICATIONS

Linder, V. et al., "Water-Soluble Sacrificial Layers for Surface Micromachining", www.small-journal.com, 2005, 1, No. 7, 7 pgs.
(Continued)

*Primary Examiner* — Yewebdar Tadesse
(74) *Attorney, Agent, or Firm* — Blakely Sokoloff Taylor & Zafman (57) ABSTRACT Improved wafer coating processes, apparatuses, and systems are described. In one embodiment, an improved spin-coating process and system is used to form a mask for dicing a semiconductor wafer with a laser plasma dicing process. In one embodiment, a spin-coating apparatus for forming a film over a semiconductor wafer includes a rotatable stage configured to support the semiconductor wafer. The rotatable stage has a downward sloping region positioned beyond a perimeter of the semiconductor wafer. The apparatus includes a nozzle positioned above the rotatable stage and configured to dispense a liquid over the semiconductor wafer. The apparatus also includes a motor configured to rotate the rotatable stage.

10 Claims, 9 Drawing Sheets (51) Int. Cl.
*B05C 13/02* (2006.01)
*B05C 13/00* (2006.01)
*H01L 21/02* (2006.01)
*B05B 1/00* (2006.01)
*B05B 3/10* (2006.01)
*H01L 21/308* (2006.01)
*H01L 21/683* (2006.01)
*H01L 21/78* (2006.01)
*H01L 21/67* (2006.01)

(52) U.S. Cl.
CPC ........ *B05B 3/1035* (2013.01); *H01L 21/3081* (2013.01); *H01L 21/3086* (2013.01); *H01L 21/6715* (2013.01); *H01L 21/6835* (2013.01); *H01L 21/78* (2013.01); *H01L 2221/68327* (2013.01)

(56) References Cited

U.S. PATENT DOCUMENTS

| | | |
|---|---|---|
| 4,339,528 A | 7/1982 | Goldman |
| 4,684,437 A | 8/1987 | Donelon et al. |
| 5,336,638 A | 8/1994 | Suzuki et al. |
| 5,376,216 A | 12/1994 | Yoshioka et al. |
| 5,593,606 A | 1/1997 | Owen et al. |
| 5,691,794 A | 11/1997 | Hoshi et al. |
| 5,952,045 A | 9/1999 | Bossart |
| 6,051,503 A | 4/2000 | Bhardwaj et al. |
| 6,057,180 A | 5/2000 | Sun et al. |
| 6,174,271 B1 | 1/2001 | Kosmowski |
| 6,248,398 B1 | 6/2001 | Talieh et al. |
| 6,300,593 B1 | 10/2001 | Poweli |
| 6,306,731 B1 | 10/2001 | Igarashi et al. |
| 6,407,363 B2 | 6/2002 | Dunsky et al. |
| 6,417,117 B1 | 7/2002 | Davis |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,387,131 B2 | 6/2008 | Kuroda et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2005/0039675 A1 | 2/2005 | Kang et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0216313 A1 | 8/2010 | Iwai et al. |
| 2010/0248451 A1 | 9/2010 | Pirogovsky et al. |
| 2011/0014777 A1 | 1/2011 | Haji et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| KR | 1020020089831 | 11/2002 |
| KR | 1020060000417 | 1/2006 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.
International Search Report and Written Opinion for Application No. PCT/US2015/010192 dated Apr. 29, 2015, 12 pages.
Office Action mailed Jul. 14, 2014, in U.S. Appl. No. 14/169,502, 9 pages.
Restriction Requirement from U.S. Appl. No. 14/169,502 mailed Apr. 4, 2014, 8 pages.
Notice of Allowance mailed Nov. 21, 2014, in U.S. Appl. No. 14/169,502, 8 pages.
International Preliminary Report on Patentability for PCT Patent Application No. PCT/US2015/010192 mailed Aug. 11, 2016, 8 pgs.

WAFER COATING

CROSS-REFERENCE TO RELATED APPLICATIONS

This application is a divisional of U.S. patent application Ser. No. 14/169,502, filed on Jan. 31, 2014, the entire contents of which are hereby incorporated by reference herein.

BACKGROUND

1) Field

Embodiments of the present invention pertain to the field of semiconductor processing and, in particular, to methods of improved wafer coating.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is required between the dies on the wafer to prevent damage to the integrated circuits, e.g., the chips and cracks are maintained at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits; three to five hundred microns often must separate the circuitry of each of the dies. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

Some alternative dicing methods may involve application of a mask via spin-coating prior to further processing operations. However, conventional spin-coating techniques for such mask application can result in residue on the backside of the wafer, resulting problems such as misalignment during the later processing operations.

SUMMARY

One or more embodiments of the invention are directed to methods, apparatuses, and systems of improved wafer coating.

According to one embodiment, a spin-coating apparatus for forming a film over a semiconductor wafer includes a rotatable stage configured to support the semiconductor wafer. The rotatable stage has a downward sloping region positioned beyond a perimeter of the semiconductor wafer. The apparatus includes a nozzle positioned above the rotatable stage and configured to dispense a liquid over the semiconductor wafer. The apparatus also includes a motor configured to rotate the rotatable stage.

In another embodiment, a spin-coating apparatus for forming a film over a substrate mounted on a carrier includes a rotatable stage configured to support the substrate mounted on the carrier. The rotatable stage includes an inner region positioned under the substrate and an outer region positioned under edges of the carrier and having a lower height than the inner region. The rotatable stage also has a downward sloping region between the inner region and the outer region. The apparatus includes a nozzle positioned above the rotatable stage and configured to dispense a liquid over the substrate, and a motor configured to rotate the rotatable stage.

In one embodiment, a spin-coating method for forming a film over a semiconductor wafer involves supporting the semiconductor wafer over a rotatable stage having a downward sloping region positioned beyond a perimeter of the semiconductor wafer. The method involves dispensing a liquid over the semiconductor wafer, and rotating the rotatable stage to form the film over the semiconductor wafer.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Methods, apparatuses, and systems for improved wafer coating are described. In the following description, numerous specific details are set forth, such as exemplary mask materials and laser plasma dicing methods in which improved wafer coating may be implemented, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

When dicing wafers that are 300 μm or thicker, the wafers are rigid enough to be directly placed on mounting tapes without die attach film (DAF). In circumstances where wafers are placed on mounting tapes without DAF, no DAF cutting process is involved. Embodiments described herein address the dicing applications of integrated circuit (IC) wafers (e.g., integrated wafers with processor chips) that have a thickness of 250 μm to 800 μm. Furthermore, embodiments address dicing applications of integrated circuit wafers with an acceptable dicing kerf width of 50 μm to 200 μm width, preferably 50 μm to 100 μm measured on the wafer front surface. A kerf width of 50 μm to 100 μm measured on the wafer front surface corresponds to a typical kerf width measured from the back side of the wafer of 30-50 μm in a laser/saw hybrid process.

In embodiments, a hybrid wafer or substrate dicing process involving an initial laser scribe and subsequent plasma etch is implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. Thus, in one embodiment, a method uses a hybrid approach employing laser scribing and plasma etching to dice the wafers. The laser scribing removes difficult-to-etch passivation layers, dielectric layers, and metal layers until the underlying silicon substrate is exposed. Plasma etching generates trenches of a depth to the target die thickness. In another embodiment, the laser etch process may involve ablating, with the laser scribing process, the entire thickness of the substrate, followed by plasma etching the substrate surfaces exposed by the laser scribing process. In one such embodiment, the plasma etching may remove semiconductor damaged by the laser ablation to improve die strength.

Thus, according to embodiments, wafer dicing methods use both laser scribing and plasma etching instead of only laser scribing or blade sawing to generate trenches in a semiconductor wafer. The laser plasma wafer dicing methods involve forming a mask (e.g., a water soluble mask) over the semiconductor wafer to protect the integrated circuits (and in some embodiments, to protect bumps or pads) from being exposed during laser scribing and/or plasma etching. The mask layer may be formed by spin-coating.

During the spin-coating process, coating residue may be ejected from the semiconductor wafer surface, and wrap onto the backside of the wafer and/or frame. Remnant residues, such as polymers, may be transformed easily to a solid state by a sol-gel process, and remain on the backside of the wafer and/or frame. The solidified residue can critically affect the flatness of the wafer frame, and result in errors that are fatal to later processing operations (e.g., laser scribing and plasma etching to dice the wafer). For example, laser scribing operations may require fine alignment, and a misaligned wafer can result in the laser spot to be out of focus. Furthermore, over time, residues ejected onto the backside of the wafer and/or frame can also cause damage and errors to transfer robots (e.g., by contaminating the robot blades used to transport wafers). Contaminated robot blades can contaminate the chuck and ring that support the wafer in processing chambers (e.g., plasma etch chambers), which can result in the wafer becoming stuck on the chuck due to the coating residue.

According to embodiments, a spin-coating apparatus includes a rotatable stage (e.g., chuck) that has a downward sloping shape. The dispensed coating material (e.g., polymer/solvent mixture) is smoothly and horizontally spun out from the wafer surface. In one such embodiment, minimal to no residue wraps onto the backside of the wafer and/or frame. Thus, the semiconductor wafer is level, enabling precise positioning of the wafer. The flatness of the wafer bottom surface also enables transferring the wafer amongst modules or stations safely and precisely, while avoiding contamination of the robot blades. The flatness of the wafer bottom surface can also enable precise alignment for other processing, such as laser scribing and plasma etching for wafer dicing. Additionally, the lack of residue on the backside of the wafer and/or frame eliminates the need for additional cleaning operations to remove the remnant residue. Embodiments thus enable a clean wafer bottom surface after spin-coating, which can be used in a variety of applications such as semiconductor fabrication and dicing, and in a variety of industries such as recording media, flat screen displays, optics, etc.

Figure 1:
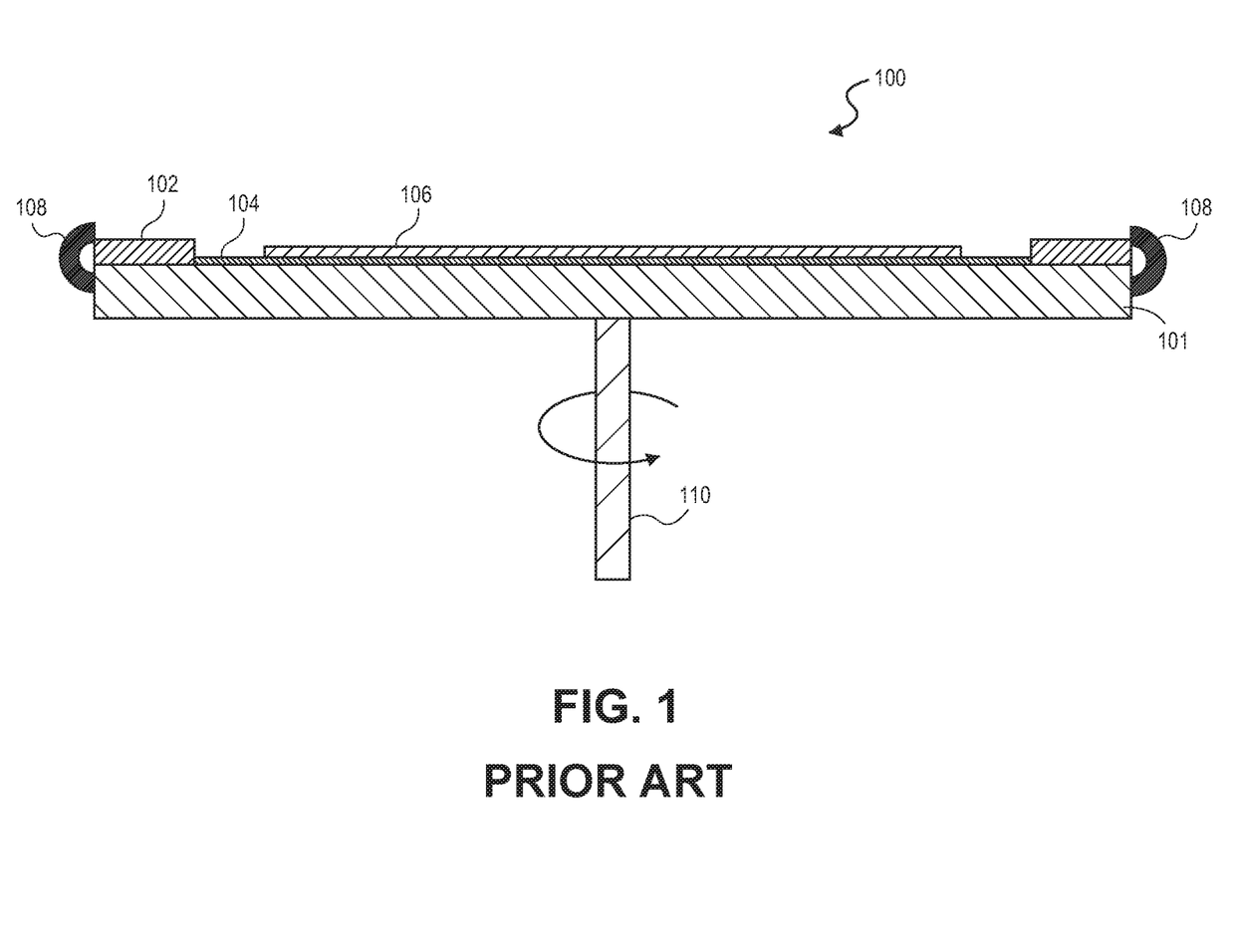
FIG. 1 is a cross-sectional view of a spin-coating apparatus with a conventional chuck design in which the wafer and the chuck on the same plane.

FIG. 1 is a cross-sectional view of a spin-coating apparatus 100 with a conventional chuck design in which the wafer 106 and the chuck 101 are on the same plane. The semiconductor wafer 106 is coupled to a wafer frame 102 with dicing tape 104. The chuck 101 supports the wafer 106, tape 104, and the wafer frame 102. A clamp 108 holds the frame 102, and therefore the wafer 106, in position. The apparatus 100 includes a spinning axis 110 around which the chuck 101, and therefore wafer 106, are rotated to distribute a dispensed liquid. As illustrated in FIG. 1, the chuck 101 has a flat top surface such that the wafer 106, dicing tape 104, and wafer frame 102 are all on approximately the same plane. The illustrated flat chuck design results in residue being ejected from the surface of the wafer 106, and attaching to the wafer frame 102, dicing tape 104, and the backside of the wafer 106. The residue attaches to the wafer frame 102, dicing tape 104, and the backside of the wafer 106 at least in part because, during spin-coating, the liquid mask material tends to spin out towards the edge of the tape frame horizontally. Thus, in conventional spin-coating apparatuses, the spun-out mask material accumulates at the edge of the wafer frame 102, which then flows underneath the wafer frame 102, causing contamination on the backside of the wafer 106.

Figure 2A:
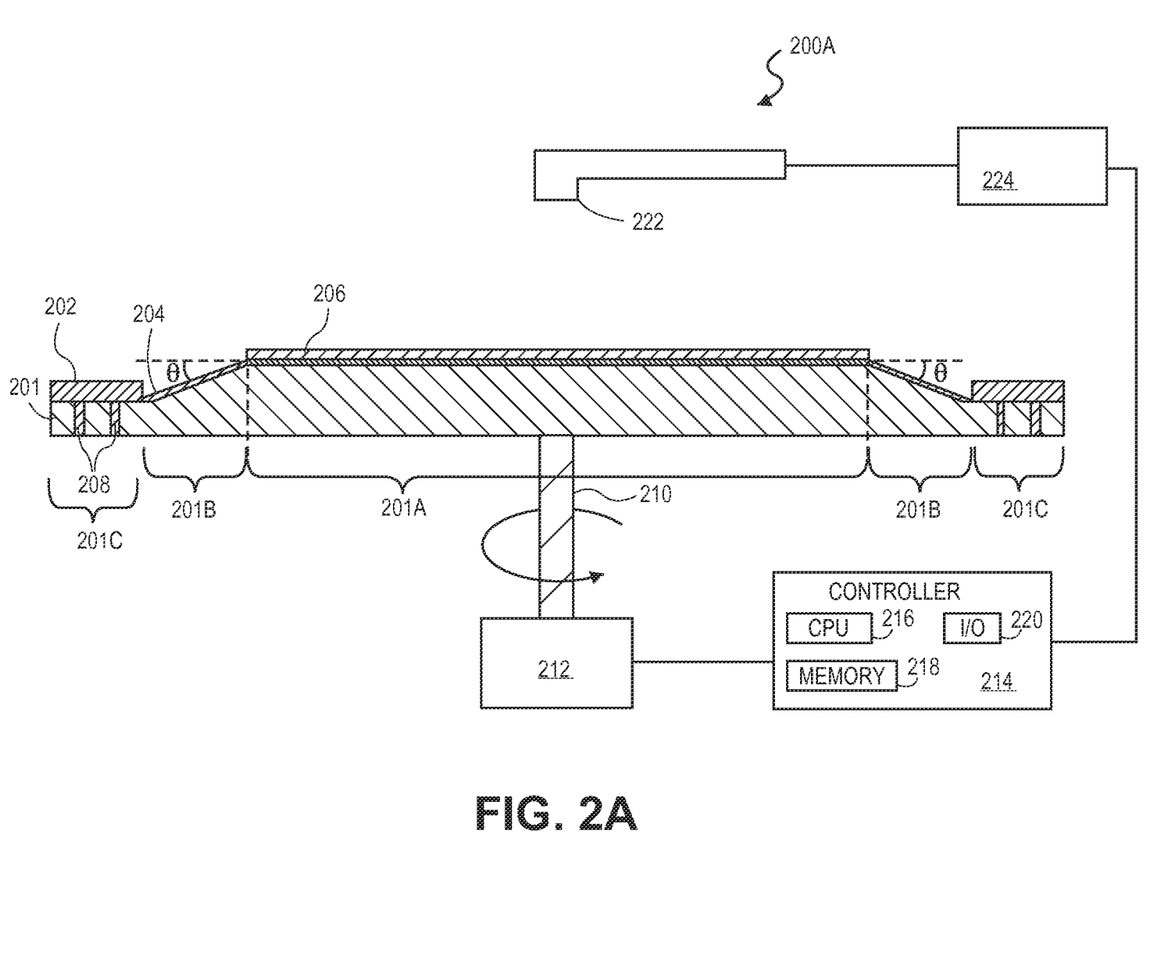
FIGS. 2A and 2B are cross-sectional views of spin-coating apparatuses with rotatable stages that have a downward sloping region positioned beyond a perimeter of the semiconductor wafer, in accordance with embodiments of the present invention.
Figure 2B:
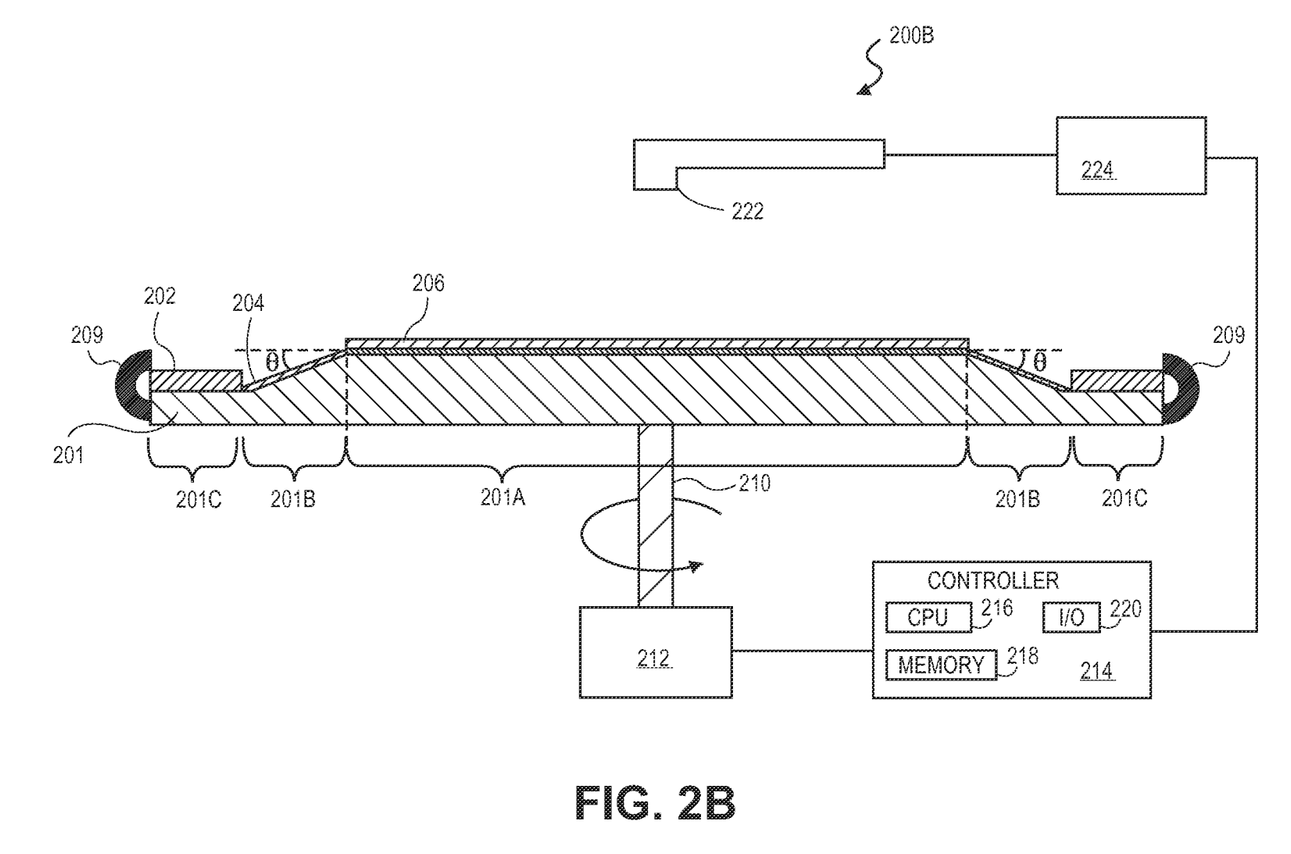

In contrast, FIGS. 2A and 2B are cross-sectional views of spin-coating apparatuses with rotatable stages that have a downward sloping region positioned beyond a perimeter of the semiconductor wafer, in accordance with embodiments of the present invention. The apparatuses 200A of FIG. 2A and 200B of FIG. 2B may be used for forming a film over a semiconductor wafer 206. The semiconductor wafer 206 is disposed over a carrier. For example, the semiconductor wafer 206 is disposed on an adhesive tape 204 (e.g., a dicing tape) and coupled to a wafer frame 202 with the adhesive tape 204. As illustrated, a rotatable stage 201 is configured to support the semiconductor wafer 206, adhesive tape 204, and wafer frame 202. The adhesive tape 204 may include, for example, a base material and a release layer (e.g., a thermal or UV curable layer). The apparatus also includes a nozzle 222 positioned above the rotatable stage 201. The nozzle 222 is configured to dispense a liquid pumped from a source 224 over the semiconductor wafer 206. A motor 212 is configured to rotate the rotatable stage around a spinning axis 210. The apparatuses 200A and 200B may also include a controller 214 to configure and/or control components of the apparatuses 200A and 200B. For example, the controller 214 may control the rate of the liquid is dispensed from the source 224 through the nozzle 222. The controller 214 includes a processor (CPU) 216, memory 218, and input/output (I/O) 220. The controller may include elements similar to, or the same as, the computer system 600 of FIG. 6.

According to embodiments, the rotatable stage has a downward sloping region 201B positioned beyond a perimeter of the semiconductor wafer 206. As illustrated, "positioned beyond" the perimeter of the semiconductor wafer 206 can include positioned at the edge of the semiconductor wafer 206. The rotatable stage may also include an inner region 201A positioned under the semiconductor wafer 206, such that the downward sloping region 201B is between the inner region 201A and edges of the rotatable stage. The inner region 201A of the stage 201 that is positioned under the semiconductor wafer 206 is substantially flat. The illustrated rotatable stage 201 also includes an outer region 201C at the edges of the rotatable stage 201, such that the downward sloping region 201B is between the inner region 201A and the outer region 201C. The outer region 201C of the rotatable stage 201 may also be flat. The outer region 201C of the rotatable stage 201 includes a holding mechanism configured to hold the wafer frame 202 over which the semiconductor wafer 206 is mounted. For example, FIG. 2A illustrates an apparatus 200A with vacuum holes 208 to secure the wafer to the. FIG. 2B illustrates an apparatus 200B with clamps 209 to secure the wafer 206 to the stage 201. The inner region 201A, the downward sloping region 201B, and the outer region 201C may be a single piece (e.g., one monolith stage), or may include multiple pieces (e.g., the inner region 201A may be one piece, and the downward sloping region 201B and/or the outer region 201C may be separate rings positioned around the inner region 201A of the rotatable stage 201).

The downward sloping region 201B has an angle θ with respect to a plane corresponding to a top surface of the stage 201 in the inner region 201A. In one embodiment, the angle θ is between 1 and 10 degrees. Due to the downward sloping region 201B being at an angle greater than 0 (e.g., in the range of approximately 1 to 10 degrees), the outer region 201C of the rotatable stage is at a lower height than the inner region 201A. As a result, the wafer frame 202 is at a lower height than the semiconductor wafer 206. Having the downward sloping region 201B at the angle θ thus helps to eliminate contamination from spin-coating residue because the spun-out mask residue will be thrown onto the sidewall of the coating chamber, leaving the wafer frame 202 untouched and preventing contamination of the backside of the wafer 206. Embodiments may also include a downward sloping region 201B that has an angle that is greater than 10 degrees, however, too large of an angle may cause excessive stress on the tape 204, which can be transferred to wafer 206, causing damage to the tape 204 and/or wafer 206.

Figure 2C:
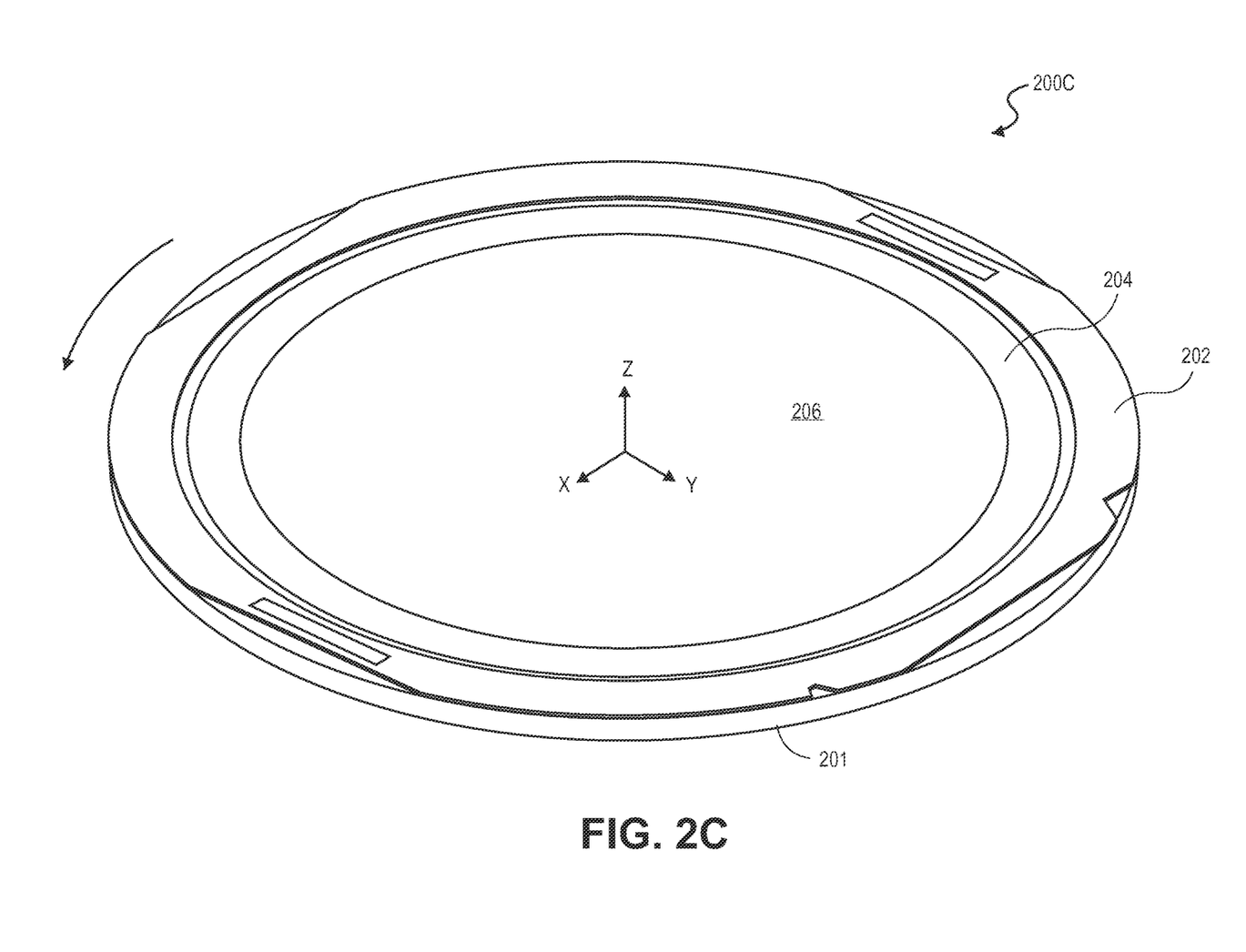
FIG. 2C is an isometric view of the spin-coating apparatuses of FIGS. 2A and 2B, in accordance with embodiments of the present invention.

FIG. 2C is an isometric view of the spin-coating apparatuses of FIGS. 2A and 2B, in accordance with embodiments of the present invention. As illustrated, the apparatus 200C includes the rotatable stage 201 to support the wafer 206. An exposed portion of the adhesive tape 204 disposed over the downward sloping region, and the wafer frame is disposed over the outer region of the rotatable stage 201. The arrow indicates a possible direction of rotation of the rotatable stage 201 to form a film over the semiconductor wafer 206 with the dispensed liquid.

Figure 3A:
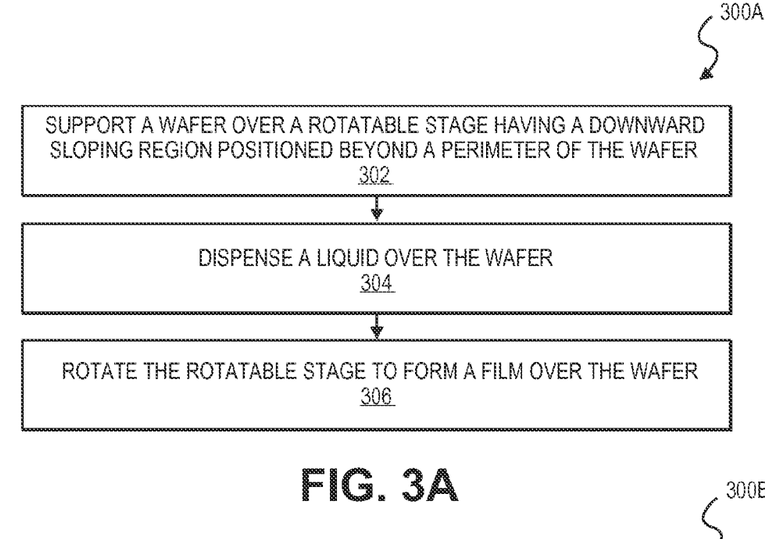
FIG. 3A is a flowchart illustrating a method for forming a film over a semiconductor wafer, in accordance with embodiments of the present invention.
Figure 3B:
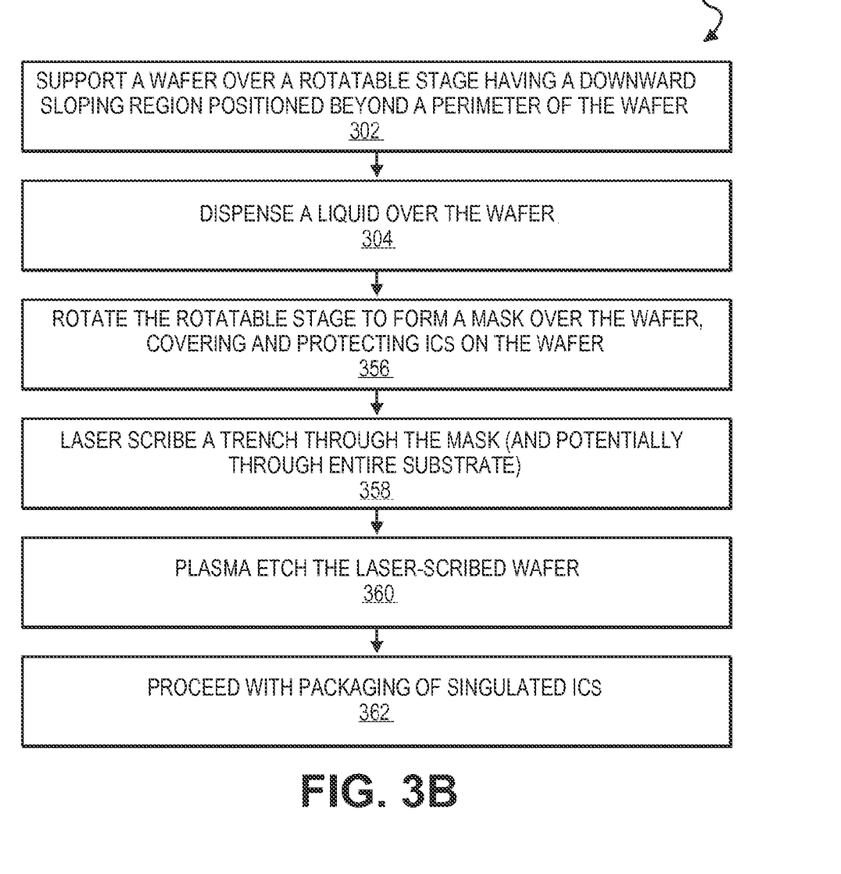
FIG. 3B is a flowchart illustrating a method of dicing a semiconductor wafer including a plurality of integrated circuits, the method including formation of a film over the semiconductor wafer, in accordance with embodiments of the present invention.

FIG. 3A is a flowchart illustrating a method 300A for forming a film over a semiconductor wafer, in accordance with embodiments of the present invention. FIG. 3B is a flowchart illustrating a method of dicing a semiconductor wafer including a plurality of integrated circuits, including formation of a film over the semiconductor wafer according to the method 300A of FIG. 3A. FIGS. 4A, 4B, 4C, and 4D illustrate cross-sectional views of a semiconductor wafer during performance of a method of dicing the semiconductor wafer, corresponding to operations of FIG. 3B, in accordance with embodiments of the present invention.

Figure 4A:
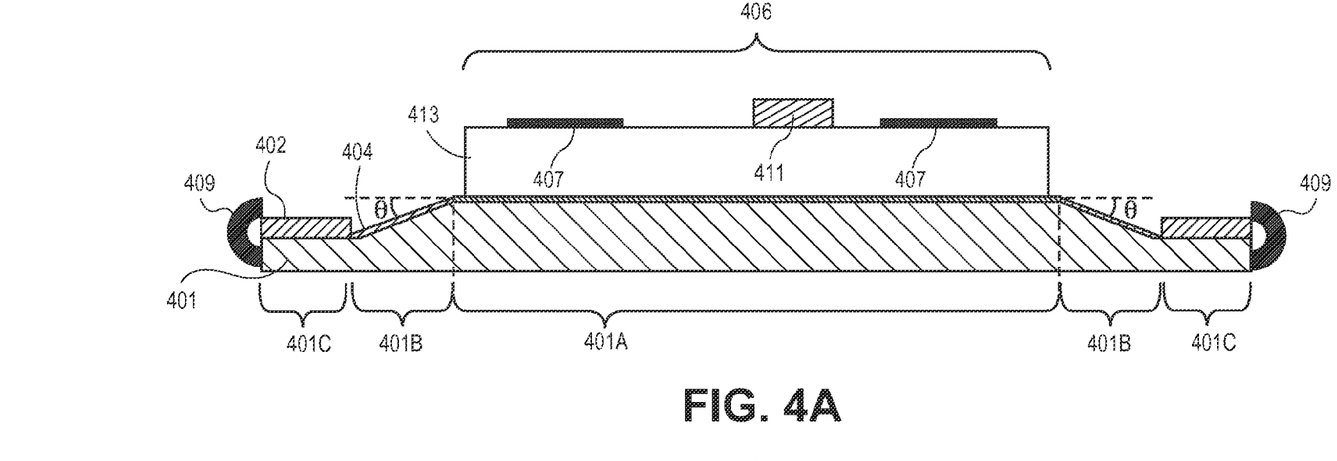
FIGS. 4A, 4B, 4C, and 4D illustrate cross-sectional views of a semiconductor wafer including a plurality of integrated circuits during performance of a method of dicing the semiconductor wafer, corresponding to operations of FIG. 3B, in accordance with embodiments of the present invention.

The method 300A of FIG. 3A and 300B of FIG. 3B begin with supporting a semiconductor wafer 406 over a rotatable stage 401 having a downward sloping region 401B positioned beyond a perimeter of the semiconductor wafer 406, at operation 302 and corresponding to FIG. 4A. The rotatable stage 401 may be similar to, or the same as, the stage 201 of FIGS. 2A and 2B. For example, the semiconductor wafer 406 may be mounted on a carrier (e.g., the wafer frame 402) with a tape 404. The wafer frame 402 may be supported by an outer region 401C of the stage 401. In the illustrated embodiment, clamps 409 hold the wafer frame 402 in place, but other holding mechanisms may be used. The method may involve positioning the semiconductor wafer 406 over an inner region 401A of the rotatable stage 401 such that an exposed section of the tape 404 is between edges of the wafer frame 402 and the semiconductor wafer 406, and is positioned over the downward sloping region 401B.

In one embodiment, the wafer 406 includes a substrate 413. According to one embodiment, the semiconductor wafer 406 has a diameter of at least 300 mm and has a thickness of 250 µm to 800 µm. The semiconductor wafer 406 has disposed on or in the substrate 413, a portion of integrated circuits 407, which include semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps or pads 411 and passivation layers may be formed above the interconnect layers. The conductive bumps or pads 411 may include solder balls. Materials making up the streets between the integrated circuits 407 may be similar to or the same as those materials used to form the integrated circuits 407. For example, streets may be composed of layers of dielectric materials, semiconductor materials, and metallization. In one embodiment, one or more of the streets includes test devices similar to the actual devices of the integrated circuits.

After supporting the wafer 406 over the rotatable stage 401, the methods 300A and 300B involve dispensing a liquid over the semiconductor wafer 406 at operation 304. In one embodiment, the dispensed liquid includes a mixture of a polymer (e.g., a water-soluble polymer) and a solvent. For example, the dispensed liquid may include one or more of: poly(vinyl alcohol) (PVA), poly(acrylic acid), poly(methacrylic acid), poly(acrylamide), or poly(ethylene oxide).

Figure 4B:
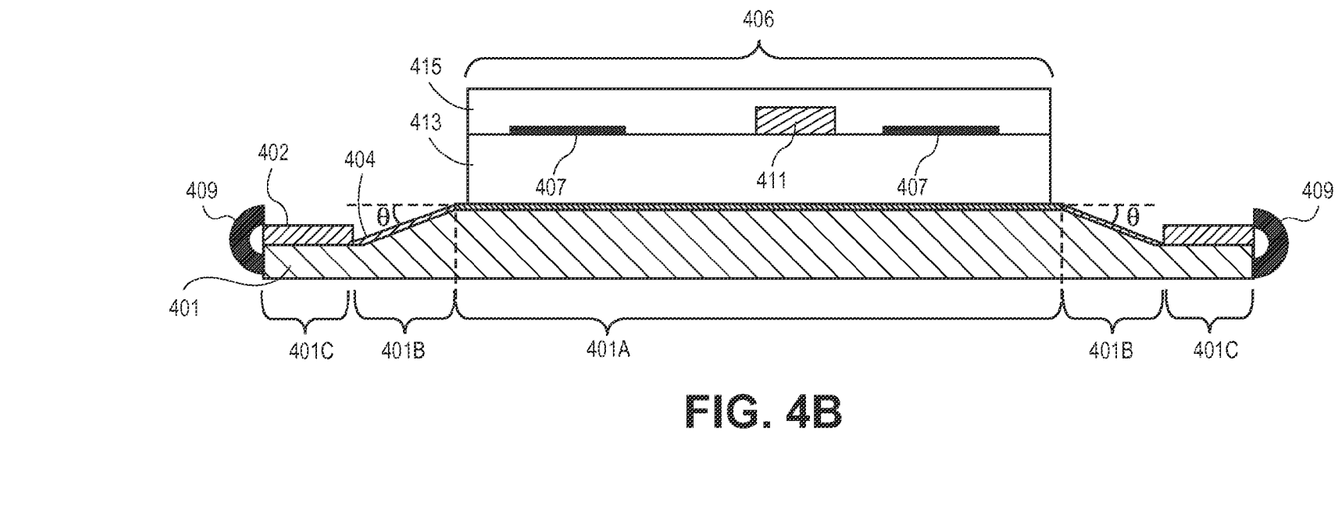

At operation 306, the method 300A includes rotating the rotatable stage 401 to form the film 415 over the semiconductor wafer 406, as illustrated in FIG. 4B. Similarly, the method 300B of FIG. 3B includes rotating the rotatable stage 401 to form a mask over the semiconductor wafer 406, covering and protecting integrated circuits 407 on the wafer, at operation 356. The film 415 may also protect the bumps or pads 411 projecting or protruding up from the surface of the semiconductor wafer 406. Additionally, the film 415 may cover intervening streets formed between adjacent ones of the integrated circuits 407. The dispensed liquid is thus distributed across the surface of the semiconductor wafer 406 to form the film 415, without resulting in significant residue on the bottom of the semiconductor wafer 406 or wafer frame 402.

Figure 4C:
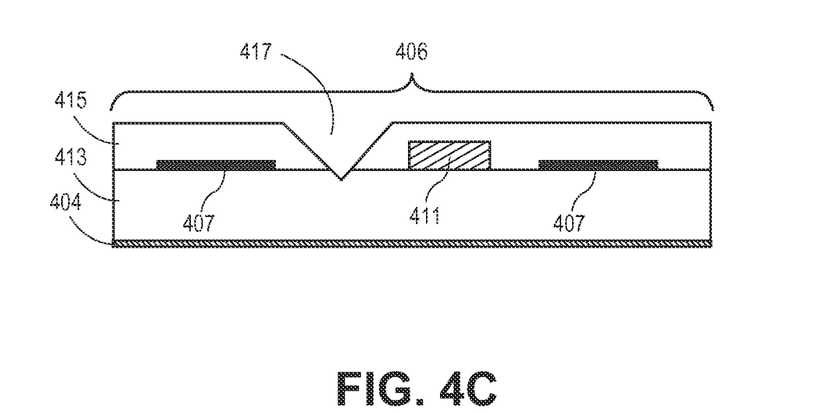

The method 300B of FIG. 3B continues with operations for dicing the semiconductor wafer 406 with a hybrid laser plasma method. In one such embodiment, the method 300B involves patterning the film 415 with a laser scribing process at operation 358, as illustrated in FIG. 4C. The laser scribing process exposes regions 417 (e.g., gaps or trenches) of the semiconductor wafer between the ICs 407. To minimize dielectric delamination and cracking, a femtosecond laser may be preferred. However, depending on the device structure, an ultraviolet (UV), picosecond, or nanosecond laser source can also be applied. The laser has a pulse repetition frequency in the range of 80 kHz to 1 MHz, ideally in the range of 100 kHz to 500 kHz.

The laser scribing process is performed generally to remove the material of the streets present between the integrated circuits. In accordance with an embodiment of the present invention, patterning the film 415 with the laser scribing process includes forming the trenches 417 partially into the regions of the semiconductor wafer 406 between the integrated circuits 407. In an embodiment, patterning the mask with the laser scribing process includes direct writing a pattern using a laser having a pulse width in the femtosecond range. Specifically, a laser with a wavelength in the visible spectrum (e.g., green band, or 500-540 nm) or the ultra-violet (UV, or 300-400 nm band) or infra-red (IR) band (the three totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask, the streets and, possibly, a portion of the semiconductor wafer or substrate.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

Under conventional laser irradiation (such as nanosecond-based or picosecond-based laser irradiation), the materials of the street may behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 400 femtoseconds are used in a femtosecond-based laser irradiation process to remove a mask, a street, and a portion of a silicon substrate. In another embodiment, pulses of approximately less than or equal to 500 femtoseconds are used.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 µJ to 100 µJ, although preferably approximately in the range of 1 µJ to 5 µJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength close to (e.g., 500-540 nm), or in the UV range (e.g., 300-400 nm) provides a cleaner ablation process than a femtosecond-based laser process having a wavelength close to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Figure 4D:
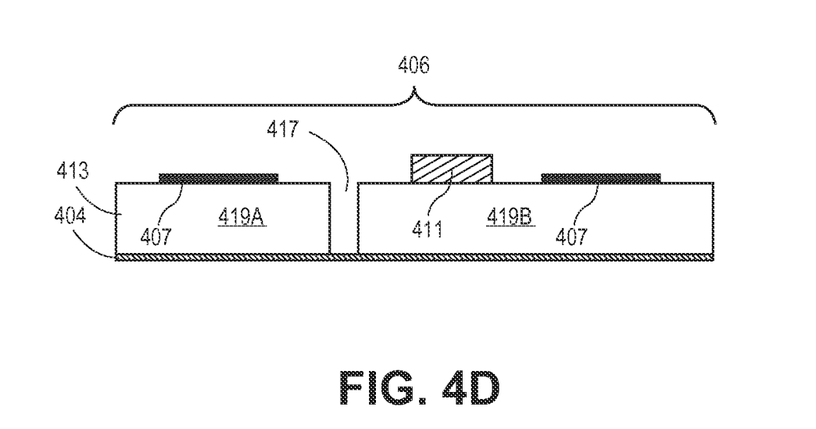

Returning to FIG. 3B and to corresponding FIG. 4D, in some embodiments, singulation of the dies is done by plasma etching after the initial laser scribing operation. For example, the method 300B includes etching the semiconductor wafer 406 through trenches 417 in the patterned film 415 to ultimately etch entirely through semiconductor wafer 406, at operation 360. In the exemplary embodiments illustrated by FIG. 4D, the plasma etching is stopped on the adhesive tape, with individualized portions 419A and 419B of the semiconductor wafer 406 separated by the trench 417.

In a specific embodiment, during the etch process the etch rate of the material of semiconductor wafer 206 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than is possible with capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. Multi-RF source configurations also results in an exceptionally wide process window. However, any plasma etch chamber capable of etching silicon may be used, at least in theory, for example, if throughput is not of paramount importance.

In an exemplary embodiment, a deep silicon etch is used to etch a single crystalline silicon substrate or wafer 406 at an etch rate greater than approximately 40% of conventional silicon etch rates (e.g., 40 µm, or more) while maintaining essentially precise profile control and virtually scallop-free sidewalls. In a specific embodiment, a through-silicon via type etch process is used. The etch process is based on a plasma generated from a reactive gas, which generally is a fluorine-based gas such as $NF_3$, $SF_6$, $SiF_4$, $C_4F_8$, $CHF_3$, $XeF_2$, or any other reactant gas capable of etching silicon at a relatively fast etch rate.

In another embodiment, the laser scribing process singulates the dies, and a plasma etching operation may be performed to remove damaged semiconductor material resulting from the laser scribing process. For example, a plasma etch operation may remove a portion of semiconductor from the sidewalls of the scribed trenches. According to embodiments, the singulated dies need sufficiently high die break strengths to ensure reliable die pick and place and subsequent assembly processes. It has been found that the rough, damaged sidewalls present following the laser ablation operation may unacceptably reduce die break strength. However, it has also been found that the damage layer in a silicon substrate for a femtosecond laser is less than 3 µm thick and that a higher die break strength can be achieved by performing the plasma etch operation 360 to remove a comparable thickness of semiconductor from sidewalls exposed by the trench 417.

Vertical etch rates of 10 µm/min are expected with lateral etch rate being between 50 and 100% of that, depending on process conditions. As such, etch time is generally within 10 to 90 sec, depending on the desired undercut and/or remaining thickness of the substrate.

After plasma etching at operation 360 of FIG. 3B, the method may involve removal of the film 415 (as illustrated in FIG. 4D), and operations for proceeding with packaging of the singulated ICs, at operation 362.

Thus, FIGS. 3A and 3B depict methods of forming a film over a semiconductor wafer without contaminating the wafer frame and/or bottom side of the semiconductor wafer with residue from mask formation. FIG. 3B further includes operations for dicing a semiconductor wafer or substrate involving formation of the mask according to embodiments herein.

Figure 5:
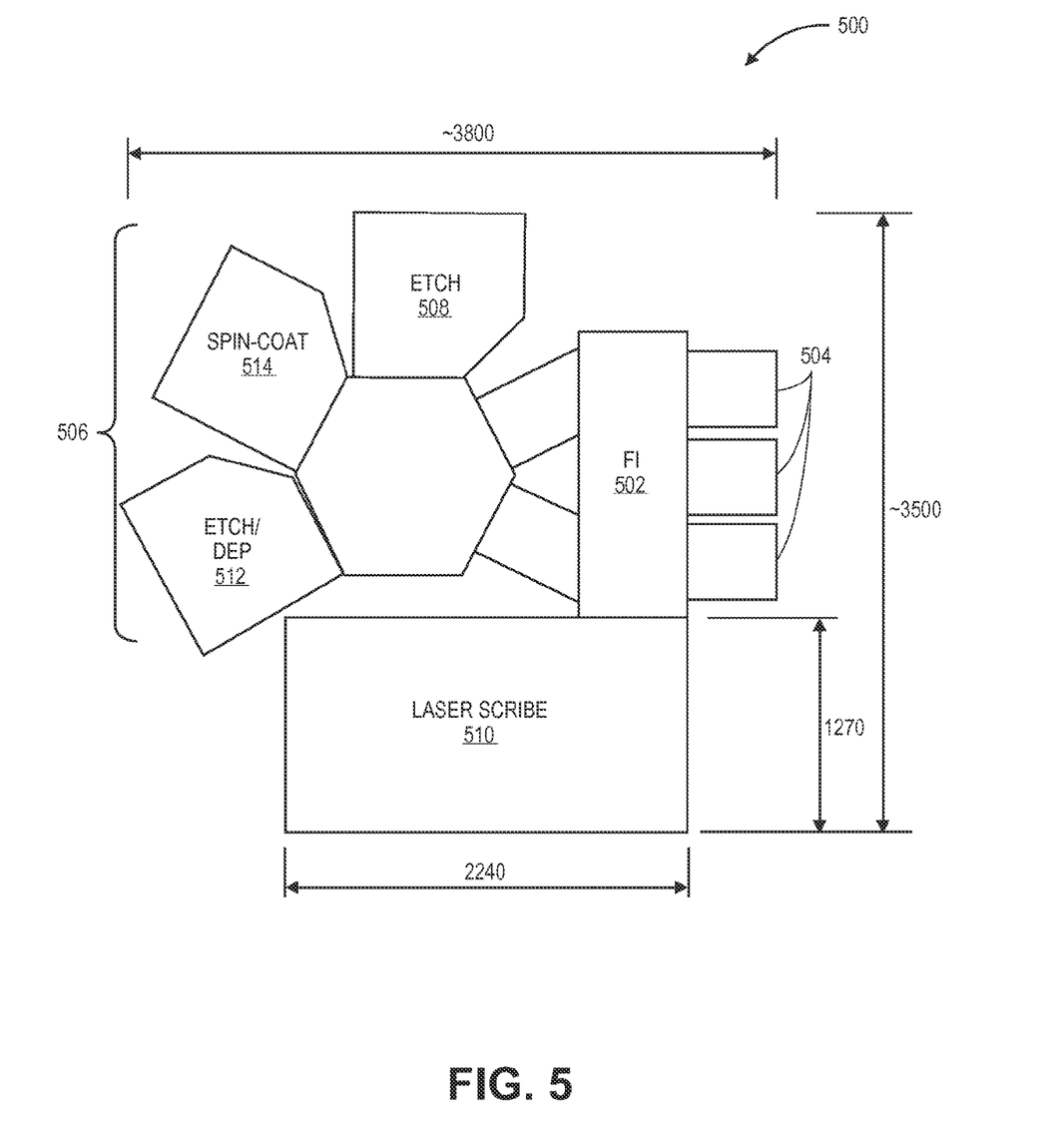
FIG. 5 illustrates a block diagram of a tool layout for laser and plasma dicing of substrates, including a spin-coating module, in accordance with an embodiment of the present invention.

Turning to FIG. 5, a single integrated platform 500 may be configured to perform many or all of the operations in the hybrid laser ablation-plasma etch singulation process 300B of FIG. 3B. For example, FIG. 5 illustrates a block diagram of a cluster tool 506 coupled with laser scribe apparatus 510 for laser and plasma dicing of substrates, in accordance with an embodiment of the present invention. Referring to FIG. 5, the cluster tool 506 is coupled to a factory interface 502 (FI) having a plurality of load locks 504. The factory interface 502 may be a suitable atmospheric port to interface between an outside manufacturing facility with laser scribe apparatus 510 and cluster tool 506. The factory interface 502 may include robots with arms or blades for transferring substrates (or carriers thereof) from storage units (such as front opening unified pods) into either cluster tool 506 or laser scribe apparatus 510, or both.

A laser scribe apparatus 510 is also coupled to the FI 502. In an embodiment, the laser scribe apparatus 510 includes a femtosecond laser operating in the 300-540 nm band. The femtosecond laser to performing the laser ablation portion of the hybrid laser and etch singulation processes 300B of FIG. 3B. In one embodiment, a moveable stage is also included in laser scribe apparatus 510, the moveable stage configured for moving a wafer or substrate (or a carrier thereof) relative to the femtosecond-based laser. In a specific embodiment, the femtosecond laser is also moveable.

The cluster tool 506 includes one or more plasma etch chambers 508 coupled to the FI by a robotic transfer chamber housing a robotic arm for in-vaccuo transfer of substrates. The plasma etch chambers 508 is suitable for performing a plasma etch portion of the hybrid laser and etch singulation process 300B of FIG. 3B. In one exemplary embodiment, the plasma etch chamber 508 is further coupled to an $SF_6$ gas source and at least one of a $C_4F_8$ and $C_4F_6$ source. In one embodiment, the plasma etch chamber 508 is coupled to an $SF_6$ gas source and at least one of a $C_4F_8$, $CF_4$, and $C_4F_6$ source. In a specific embodiment, the one or more plasma etch chambers 508 is an Applied Centura® Silvia™ Etch system, available from Applied Materials of Sunnyvale, Calif., USA, although other suitable etch systems are also available commercially. In an embodiment, more than one etch chamber 508 is included in the cluster tool 506 portion of integrated platform 500 to enable high manufacturing throughput of the singulation or dicing process.

According to the illustrated embodiment, the cluster tool 506 also includes a spin-coating module 514. The spin-coating module 514 may include a spin-coating apparatus as described herein configured to perform a spin-coating method such as the method 300A of FIG. 3A. A deposition chamber or an additional etch chamber 512 may also be included for deposition or etch of other layers (e.g., deposition of an underfill layer).

Figure 6:
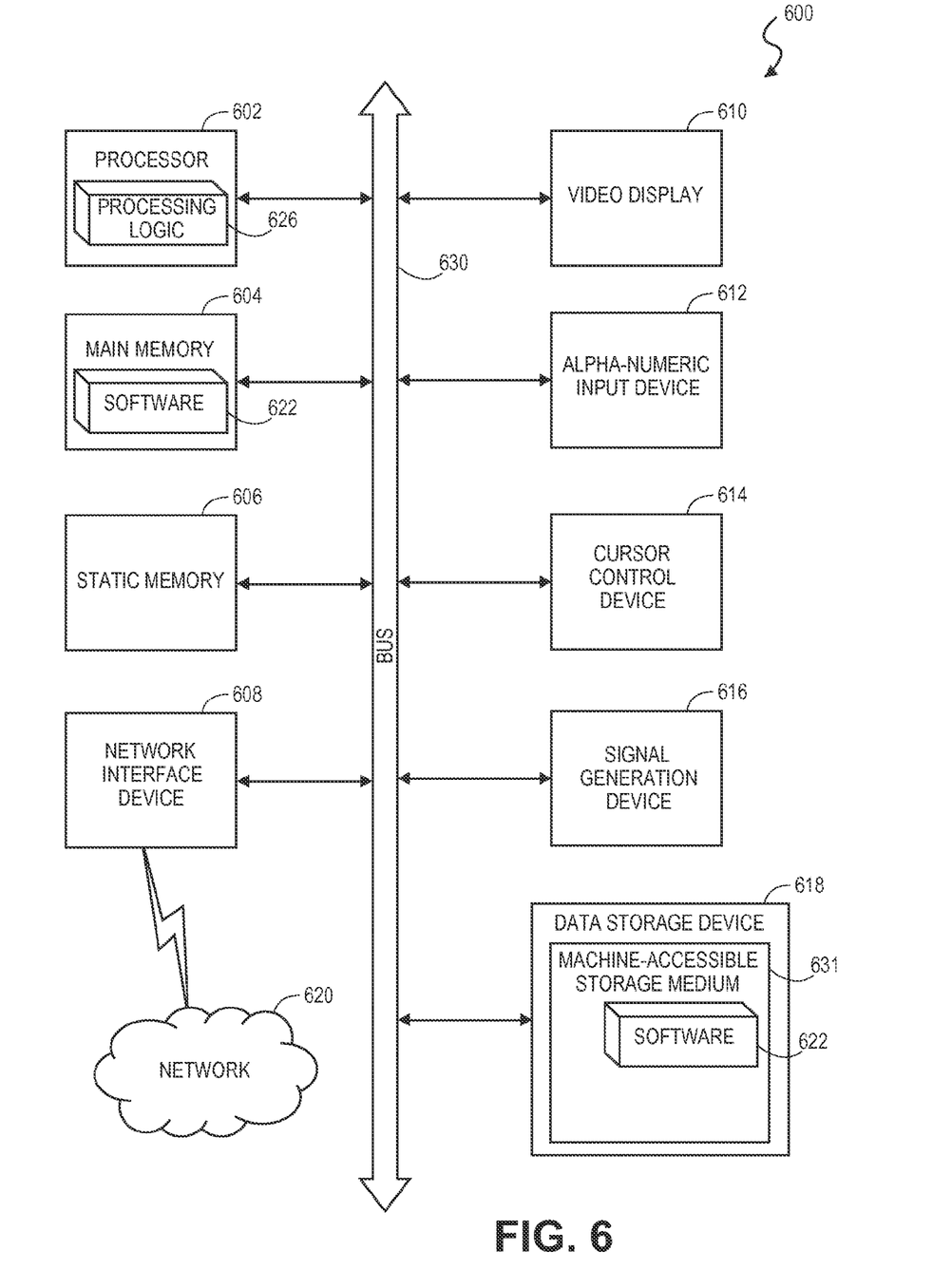
FIG. 6 illustrates a block diagram of an exemplary computer system which controls automated performance of one or more operations in the masking, laser scribing, plasma dicing methods described herein, in accordance with an embodiment of the present invention.

FIG. 6 illustrates a computer system 600 within which a set of instructions, for causing the machine to execute one or more of the scribing methods discussed herein may be executed. The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, etc. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations and steps discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A spin-coating apparatus for forming a film over a substrate mounted on a carrier, the spin-coating apparatus comprising:
   a rotatable stage comprising:
      an inner region to support the substrate,
      an outer region; and
      a downward sloping region coupled with the inner region and positioned beyond a perimeter of the substrate, wherein the outer region of the rotatable stage is located beyond the downward sloping region, and wherein the outer region is flat, and wherein the inner region, downward sloping region, and outer region of the rotatable stage are one piece;
a nozzle positioned above the rotatable stage and configured to dispense a liquid over the substrate; and
a motor configured to rotate the rotatable stage.

2. The spin-coating apparatus of claim 1, wherein the downward sloping region has an angle that is between 1 and 10 degrees.

3. The spin-coating apparatus of claim 1, wherein the inner region positioned under the substrate is substantially flat.

4. The spin-coating apparatus of claim 1, wherein the outer region of the rotatable stage comprises a holding mechanism configured to hold a wafer frame over which the substrate is mounted.

5. A spin-coating apparatus for forming a film over a substrate mounted on a carrier, the spin-coating apparatus comprising:
a rotatable stage configured to support the substrate mounted on the carrier, wherein the rotatable stage comprises:
an inner region positioned under the substrate,
an outer region positioned under edges of the carrier and having a lower height than the inner region, and
a downward sloping region between the inner region and the outer region;
a nozzle positioned above the rotatable stage and configured to dispense a liquid over the substrate; and
a motor configured to rotate the rotatable stage.

6. The spin-coating apparatus of claim 5, wherein the downward sloping region has an angle that is between 1 and 10 degrees.

7. The spin-coating apparatus of claim 5, wherein the inner region positioned under the substrate is substantially flat.

8. The spin-coating apparatus of claim 5, wherein the outer region of the rotatable stage comprises a holding mechanism configured to hold a wafer frame over which the substrate is mounted.

9. The spin-coating apparatus of claim 8, wherein the outer region of the rotatable stage is flat.

10. The spin-coating apparatus of claim 8, wherein the inner region, downward sloping region, and outer region of the rotatable stage are one piece.

* * * * *